US011662257B2

United States Patent
Herceg et al.

(10) Patent No.: US 11,662,257 B2
(45) Date of Patent: May 30, 2023

(54) APPARATUS, SYSTEM AND METHOD FOR REMOTE SENSING AND RESETTING ELECTRICAL CHARACTERISTICS OF A MEMRISTOR

(71) Applicant: Nokia Technologies Oy, Espoo (FI)

(72) Inventors: Marijan Herceg, Osijek (HR); Tomislav Matic, Osijek (HR)

(73) Assignee: NOKIA TECHNOLOGIES OY, Espoo (FI)

( * ) Notice: Subject to any disclaimer, the term of this patent is extended or adjusted under 35 U.S.C. 154(b) by 229 days.

(21) Appl. No.: 16/919,966

(22) Filed: Jul. 2, 2020

(65) Prior Publication Data
US 2021/0018374 A1     Jan. 21, 2021

(30) Foreign Application Priority Data
Jul. 15, 2019  (EP) .................................... 19186374

(51) Int. Cl.
*G01K 7/16*     (2006.01)
*G11C 11/00*    (2006.01)
(Continued)

(52) U.S. Cl.
CPC ............. *G01K 7/16* (2013.01); *G01K 1/024* (2013.01); *G01K 1/08* (2013.01); *G01K 3/005* (2013.01);
(Continued)

(58) Field of Classification Search
CPC ............ G01K 7/16; G01K 1/024; G01K 1/08; G01K 3/005; G11C 11/00; G11C 11/21; G11C 13/0097; G11C 13/0007; G11C 13/004; G11C 13/0069; G11C 13/0002; G11C 13/0021; G11C 2013/0073
See application file for complete search history.

(56) References Cited

U.S. PATENT DOCUMENTS 10,559,893 B1 *   2/2020  Corum .................... H04B 10/85
2010/0332941 A1 * 12/2010  Gilson .................... H04L 1/0025
                                                    714/E11.032
(Continued)

FOREIGN PATENT DOCUMENTS

CN   206672002 U   * 11/2017
CN   108665061 A     10/2018
(Continued)

OTHER PUBLICATIONS

Chua, "Memristor—The missing circuit element", IEEE Transactions on Circuit Theory, vol. 18, No. 5, Sep. 1971, pp. 507-519.
(Continued)

*Primary Examiner* — Sultana Begum
(74) *Attorney, Agent, or Firm* — Alston & Bird LLP

(57) ABSTRACT

An apparatus comprising: a memristor; means for wirelessly receiving, from another apparatus, a time-varying signal; means for enabling, responsive to the received time-varying signal, provision of one or more pulses to the memristor to change an electrical characteristic of the memristor; means for wirelessly signalling to the other apparatus when the electrical characteristic of the memristor reaches a threshold value; and means for re-setting the electrical characteristic of the memristor.

20 Claims, 8 Drawing Sheets

(51) Int. Cl.
*G01K 1/024* (2021.01)
*G01K 1/08* (2021.01)
*G01K 3/00* (2006.01)
*G11C 11/21* (2006.01)
*G11C 13/00* (2006.01)

(52) U.S. Cl.
CPC .............. *G11C 11/00* (2013.01); *G11C 11/21* (2013.01); *G11C 13/0002* (2013.01); *G11C 13/0021* (2013.01); *G11C 13/0097* (2013.01)

(56) References Cited

U.S. PATENT DOCUMENTS

| | | | |
|---|---|---|---|
| 2012/0011092 A1 | 1/2012 | Tang et al. | |
| 2013/0066451 A1* | 3/2013 | Ganesan | H04B 1/0007 375/346 |
| 2017/0141302 A1 | 5/2017 | Bessonov et al. | |
| 2018/0108403 A1 | 4/2018 | Ge et al. | |
| 2020/0258587 A1* | 8/2020 | Li | G11C 15/046 |

FOREIGN PATENT DOCUMENTS

| | | | | |
|---|---|---|---|---|
| DE | 10145271 A1 * | 4/2003 | ............ | H02J 7/1438 |
| WO | 2016/018361 A1 | 2/2016 | | |

OTHER PUBLICATIONS

Chua et al., "Memristive devices and systems", Proceedings of the IEEE, vol. 64, No. 2, Feb. 1976, pp. 209-223.
Strukov et al., "The missing Memristor found", Nature, vol. 453, May 1, 2008, pp. 80-83.
Graves et al., "Temperature and field-dependent transport measurements in continuously tunable tantalum oxide memristors expose the dominant state variable", Applied Physics Letters, vol. 110, Mar. 20, 2017, pp. 123501-1-123501-5.
Kocyigit et al., "Temperature-dependent CV characteristics of Au/ZnO/n-Si device obtained by atomic layer deposition technique", Journal of Materials Science: Materials in Electronics, vol. 28, Jan. 23, 2017, pp. 5880-5886.
Singh et al., "Temperature dependent analytical modeling and simulations of nanoscale memristor", Engineering Science and Technology, an International Journal, vol. 21, 2018, pp. 862-868.
Wang et al., "Spintronic Memristor Temperature Sensor", IEEE Electron Device Letters, vol. 31, No. 1, Jan. 2010, pp. 20-22.
Chang et al., "Synaptic behaviors and modeling of a metal oxide memristive device", Applied Physics A, vol. 102, Feb. 5, 2011, pp. 857-863.
Pershin et al., "Practical Approach to Programmable Analog Circuits With Memristors", IEEE Transactions on Circuits and Systems I: Regular Papers, vol. 57, No. 8, Aug. 2010, pp. 1857-1864.
Mandal et al., "Power-Efficient Impedance-Modulation Wireless Data Links for Biomedical Implants", IEEE Transactions on Biomedical Circuits and Systems, vol. 2, No. 4, Dec. 2008, pp. 301-315.
Nguyen et al., "Statistical Memristor-Based Temperature Sensors without Analog-to-Digital Conversion", IEEE 7th Non-Volatile Memory Systems and Applications Symposium (NVMSA), 2018, pp. 99-104.
Tan et al., "Wireless Passive Temperature Sensor Realized on Multilayer HTCC Tapes for Harsh Environment", Journal of Sensors, vol. 2015, Article ID 124058, Sep. 1, 2014, pp. 1-8.
Campbell, "Self-directed Channel Memristor for High Temperature Operation", Microelectronics Journal, vol. 59, 2017, pp. 10-14.
Extended European Search Report received for corresponding European Patent Application No. 19186374.5, dated Jan. 20, 2020, 7 pages.

* cited by examiner

APPARATUS, SYSTEM AND METHOD FOR REMOTE SENSING AND RESETTING ELECTRICAL CHARACTERISTICS OF A MEMRISTOR

TECHNOLOGICAL FIELD

Embodiments of the present disclosure relate to remote sensing.

BACKGROUND

It can be desirable to remotely sense a measurable parameter. A probe apparatus can be used to probe a target apparatus that measures the parameter and wirelessly signals the measured parameter value to the probe apparatus.

BRIEF SUMMARY

According to various, but not necessarily all, embodiments there is provided an apparatus comprising:
a memristor;
means for wirelessly receiving, from another apparatus, a time-varying signal;
means for enabling, responsive to the received time-varying signal, provision of one or more pulses to the memristor to change an electrical characteristic of the memristor;
means for wirelessly signalling to the other apparatus when the electrical characteristic of the memristor reaches a threshold value; and
means for re-setting the electrical characteristic of the memristor.

In some but not necessarily all examples, the means for enabling, responsive to the received time-varying signal, provision of one or more pulses is configured to provide, responsive to the received time-varying signal, a periodic sequence of pulses.

In some but not necessarily all examples, the means for re-setting the electrical characteristic of the memristor is configured to reset the memristor to a first value of the electrical characteristic of the memristor, for example a first resistance value.

In some but not necessarily all examples, the means for wirelessly signalling is configured to wirelessly signal when the electrical characteristic of the memristor reaches the threshold value.

In some but not necessarily all examples, the number of pulses provided to the memristor to change the electrical characteristic of the memristor from the first value to reach the threshold value is a temperature indicator.

In some but not necessarily all examples, the first value is a resistance value and is greater than the threshold value and each provided pulse reduces a resistance of the memristor.

In some but not necessarily all examples, the received time-varying signal is a regular periodic signal used as a synchronisation signal.

In some but not necessarily all examples, the apparatus comprises a resonant electrical circuit configured to provide at least part of the means for wirelessly receiving, from another apparatus, the time-varying signal and at least part of the means for wirelessly signalling to the other apparatus when the electrical characteristic of the memristor reaches the threshold value.

In some but not necessarily all examples, an impedance of the resonant circuit is modified when the electrical characteristic of the memristor reaches the threshold value.

In some but not necessarily all examples, the means for wirelessly signalling to the other apparatus when the electrical characteristic of the memristor reaches a threshold value comprises a voltage divider circuit, the voltage divider circuit comprising the memristor as a variable resistor connected via a node to a fixed resistor, and a comparator configured to receive an input from the node of the voltage divider circuit.

In some but not necessarily all examples, the one or more pulses are square wave pulses that have a fixed amplitude and a fixed width.

In some but not necessarily all examples, the apparatus comprises a pulse generator wherein pulse generation is enabled by and synchronised to the time-varying signal.

In some but not necessarily all examples, the apparatus is configured to operate in a first sensing mode or a second re-set mode wherein during the first sensing mode the apparatus is configured to alternately
(i) provide a fixed number of one or more controlled pulses of a first polarity to the memristor to change an electrical characteristic of the memristor in a first sense; and
(ii) measure the electrical characteristic of the memristor.

If the electrical characteristic of the memristor has reached the threshold value, the apparatus can, in some examples, wirelessly signal to the other apparatus that the electrical characteristic of the memristor has reached the threshold value and then switch from the first sensing mode to the second re-set mode for re-setting the electrical characteristic of the memristor.

In some but not necessarily all examples, during the second re-set mode the apparatus is configured to re-set the electrical characteristic of the memristor, wherein re-setting the electrical characteristic of the memristor comprises repeatedly provide a pulse of a second polarity to the memristor to change an electrical characteristic of the memristor in a second sense.

In some but not necessarily all examples, the apparatus comprises a circuit comprising a plurality of switches that are configurable to:
a first configuration for applying a pulse of a first sense to the memristor or a second configuration for measuring the electrical characteristic of the memristor or a third configuration for repeatedly applying a pulse of a second sense to the memristor.

In some but not necessarily all examples, the plurality of switches comprise at least one switch, controlled by the time-varying signal, for switching between the first configuration and the second configuration and at least one switch, actuated when the electrical characteristic of the memristor reaches the threshold value, for switching to the third configuration.

In some but not necessarily all examples, in the first configuration a pulse generator or the pulse generator is configured to apply a pulse of the first sense and controlled form to the memristor that is synchronised to the time-varying signal.

In some but not necessarily all examples, in the third configuration a train of pulses of the second sense is applied to the memristor based on rectification of the time-varying signal. In some but not necessarily all examples, the train of pulses has a fixed duration that is sufficient to re-set the electrical characteristic of the memristor.

In some but not necessarily all examples, the apparatus is configured in a protective non-toxic housing suitable for in-vivo use.

In some but not necessarily all examples, there is provided a system comprising: the apparatus and the other apparatus. In some but not necessarily all examples, the other apparatus comprises:
means for wirelessly providing the time-varying signal;
means for wirelessly detecting a signal indicating that the electrical characteristic of the memristor has reached a threshold value; and
means for estimating a temperature of the apparatus in dependence upon when the signal is wirelessly detected.

In some but not necessarily all examples, the other apparatus comprises:
means for determining a number of pulses applied to the memristor by the apparatus between a preceding reset of the memristor and detecting the signal indicating that the electrical characteristic of the memristor has reached a threshold value; and
means for using the determined number of pulses to look-up a temperature value dependent on the threshold value and the number of pulses.

According to various, but not necessarily all, embodiments there is provided examples as claimed in the appended claims.

BRIEF DESCRIPTION

Some example embodiments will now be described with reference to the accompanying drawings in which:

FIG. 10A shows another example embodiment of the subject matter described herein;

DETAILED DESCRIPTION

Figure 1:
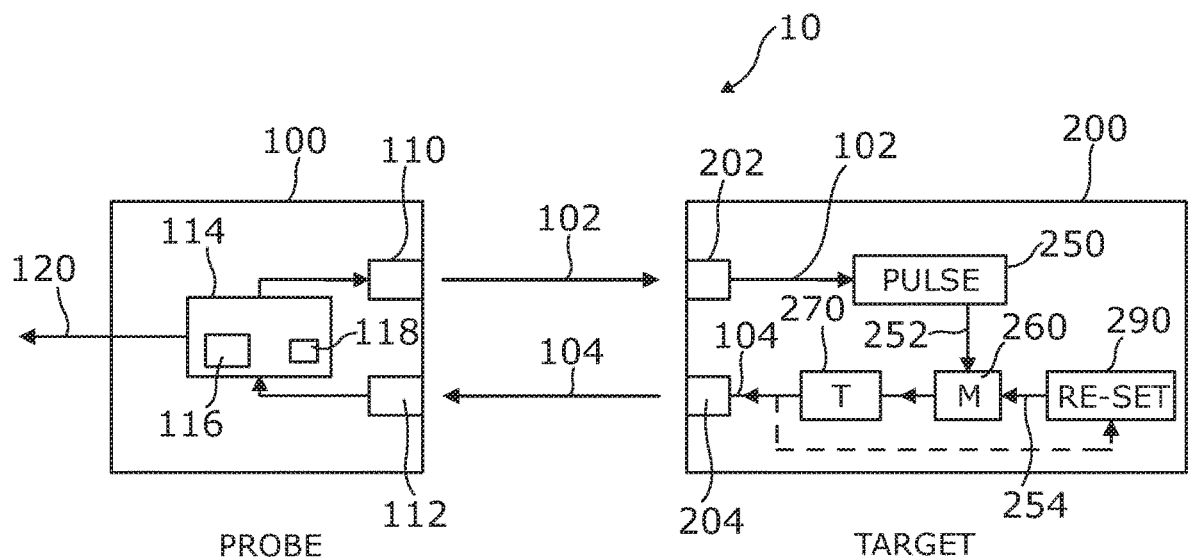
FIG. 1 shows an example embodiment of the subject matter described herein.

FIG. 1 illustrates an example of a system 10 comprising a probe apparatus 100 and a target apparatus 200. The system enables the target apparatus 200 to wirelessly signal 104 to a probe apparatus 100 when an electrical characteristic of a memristor 260, in the target apparatus 200, reaches a threshold value.

The probe apparatus 100 comprises means 110 for wirelessly providing a time-varying signal 102 to the target apparatus 200;

means 112 for wirelessly detecting a signal 104 from the target apparatus 200 indicative that an electrical characteristic of a memristor 260 in the target apparatus 200 has reached a threshold value; and means 114 for estimating a temperature at the target apparatus 200 in dependence upon when the signal 104 is wirelessly detected.

The means for wirelessly providing the time-varying signal 102, the means for wirelessly detecting the signal 104 and the means for estimating the temperature can be provided by any suitable circuitry.

The target apparatus 200 comprises a memristor 260;
means 202 for wirelessly receiving, from the probe apparatus 100, the time-varying signal 102; means 250 for enabling, responsive to the received time-varying signal 102, provision of one or more pulses 252 to the memristor 260 to change an electrical characteristic of the memristor 260;
means 204, 270 for wirelessly signaling to the probe apparatus 100 when the electrical characteristic of the memristor 260 reaches a threshold value; and means 290 for re-setting the electrical characteristic of the memristor 260.

The means 204, 270 for wirelessly receiving the time-varying signal 102, the means 250 for enabling provision of one or more pulses 252, the means 204, 270 for wirelessly signaling to the probe apparatus 100 and the means 290 for re-setting the electrical characteristic of the memristor 260 can be provided by any suitable circuitry.

The means 290 for re-setting the electrical characteristic of the memristor 260 is configured, in at least some examples, to re-set the electrical characteristic of the memristor 260 with respect to the threshold value, such that the electrical characteristic of the memristor 260 no longer reaches the threshold value. Thus, after re-set, provision of pulses 252 to the memristor 260 will change the electrical characteristic of the memristor 260 such that, with the provision of sufficient pulse, it will reach the threshold value again.

In some, but not necessarily all, examples, the means 290 for re-setting the electrical characteristic of the memristor 260 is configured to re-set the memristor 260 consistently to a first value of the electrical characteristic. The number of pulses N provided to the memristor 260 to change the electrical characteristic of the memristor from the first value to reach the threshold value is temperature-dependent. The timing of when the target apparatus 200 wirelessly signals 104 to the probe apparatus 100 is indicative of the temperature at the memristor 260.

In some, but not necessarily all, examples, the means 250 for enabling, responsive to the received time-varying signal 102, provision of one or more pulses 252 is configured to provide, responsive to the received time-varying signal 102, a periodic sequence of pulses.

The electrical characteristic can, for example, be electrical resistance.

A memristor 260 is a two-terminal electronic device that has a conductance (resistance) that is varied by a history of applied current/voltage.

Figure 2A:
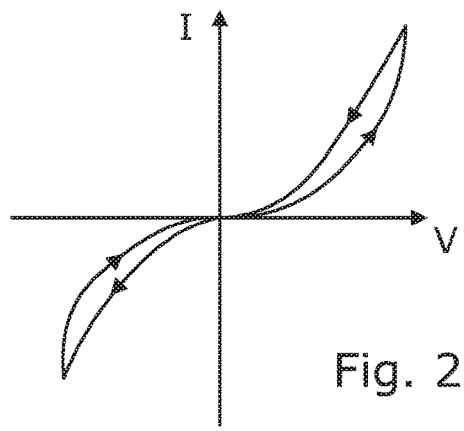
FIG. 2A shows another example embodiment of the subject matter described herein.

FIG. 2A illustrates an example of a current/voltage curve for a memristor such as the memristor 260 for example. The current/voltage curve has a pinched hysteresis. With increasing applied positive voltage, the rate of increase of conductivity (decrease in resistance) of the memristor increases from increasing very slowly to increasing very quickly. With decreasing applied positive voltage, the rate of decrease of conductivity (decrease in resistance) of the memristor decreases from decreasing quickly to decreasing slowly.

With increasing magnitude of applied negative voltage, the rate of increase of conductivity (decrease in resistance) of the memristor increases from increasing slowly to increasing quickly. With decreasing magnitude of applied negative voltage, the rate of decrease of conductivity (increase in resistance) of the memristor decreases from decreasing very quickly to decreasing very slowly. This creates hysteresis.

The gradient of the current/voltage curve at any particular point represents the conductivity of the memristor. The reciprocal of the gradient represents the resistance of the memristor.

Figure 2B:
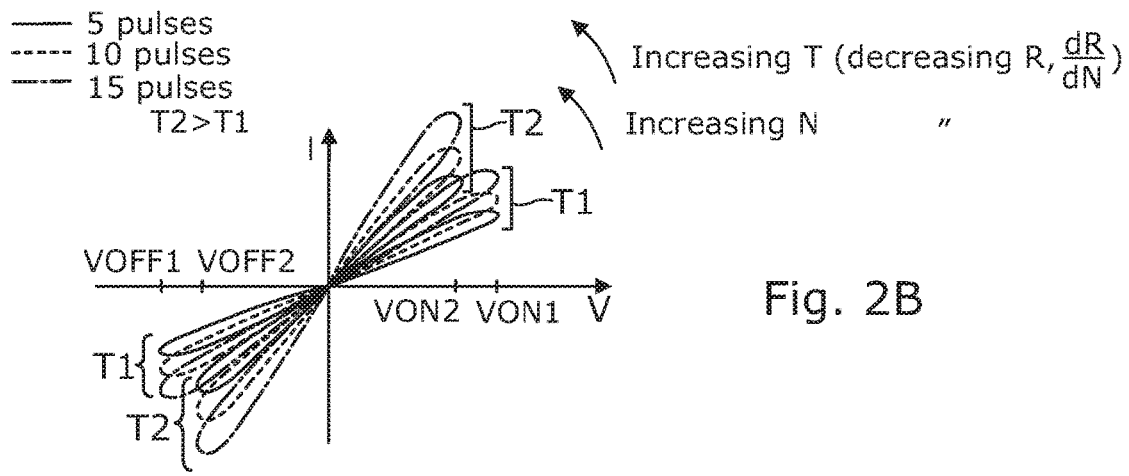
FIG. 2B shows another example embodiment of the subject matter described herein.

FIG. 2B illustrates that a memristor has an electrical characteristic, for example the resistance, that is both temperature-dependent and pulse-dependent. Applying electrical pulses of sufficient magnitude changes the current/voltage curve for the memristor and consequently changes the electrical characteristic of the memristor. Each positive pulse moves the memristor to a new current/voltage relationship, increasing conductivity and decreasing resistance. Each negative pulse moves the memristor to a new current/voltage relationship, decreasing conductivity and increasing resistance.

Varying the temperature of the memristor also changes the current/voltage relationship. As illustrated in FIG. 2B, increasing the temperature increases the conductivity and decreases the resistance and decreasing the temperature decreases the conductivity and increases the resistance.

As can be seen from FIG. 2B, the memristor 260 therefore has a particular current/voltage relationship that is dependent upon both the number of pulses that have been applied to the memristor 260 and the temperature of the memristor 260. It is therefore possible to calibrate the memristor resistance against the number of pulses applied to the memristor 260 and the temperature of the memristor 260. If a value for the resistance is known, and the number of pulses applied is also known, then the temperature can be determined. Determination can for example occur via a look-up table 118.

The probe apparatus 100 is configured to remotely detect when the resistance of the memristor 260 reaches a threshold resistance value, determine the number of pulses applied to the memristor (or an equivalent parameter) since a preceding re-set of the memristor 260 and use that number of pulses (or the equivalent parameter) to look up a temperature value dependent upon the threshold resistance value and the number of pulses.

Various examples of memristors 260 have been described in the scientific literature. In one example, one electrode of the memristor 260 is formed from palladium and another electrode of the memristor 260 is formed from tungsten. A tungsten oxide switching layer is formed on the tungsten electrode between the palladium electrode and the tungsten electrode. This can for example occur via rapid thermal annealing in pure oxygen at 400° C. of the tungsten electrode. The tungsten electrode can then be grounded and a voltage applied to the palladium electrode. In this example the pulses 252 applied to the memristor 260 can, for example, have a size of 1.4 volts and a duration of 400 microseconds.

It is possible to create other memristor 260, for example, using Cu/WO3/W, Cu/WO3/Pt, Ag/WO3/W, Ag/WO3/Pt.

When the pulses 252 applied to the memristor 260 are periodic and of the same or substantially the same size, then the probe apparatus 100 can measure the number of pulses applied to the memristor 260 by measuring a time, using a timer 116, between when the pulses 252 are first applied to the memristor 260 after re-set of the memristor 260 and when the resistance of the memristor 252 reaches the threshold value. As the memristor 260 is re-set when the resistance of the memristor reaches the threshold value, then the timing between the probe apparatus 100 receiving consecutive signals 104 indicative that the memristor 260 has a resistance that has reached the threshold value, after re-set, is indicative of the number of pulses applied to the memristor 260 so that its resistance reaches the threshold value, which is dependent upon the temperature at the memristor 260.

Consequently, the means 250, for enabling, responsive to the received time-varying signal 102, provision of one or more pulses 252 can be configured to provide, responsive to the received time-varying signal, a periodic sequence of pulses. The means 290 for re-setting the electrical characteristic of the memristor 260 can be configured to re-set the memristor to a first resistance value. The means 204, 270 for wirelessly signaling 104 is configured to wirelessly signal 104 when the resistance of the memristor 260 reaches the threshold value. The number of pulses provided to the memristor 260 to change the resistance of the memristor 260 from the first resistance value to reach the threshold value is a temperature indicator. The wireless signal 104 therefore facilitates temperature estimation.

Figure 3:
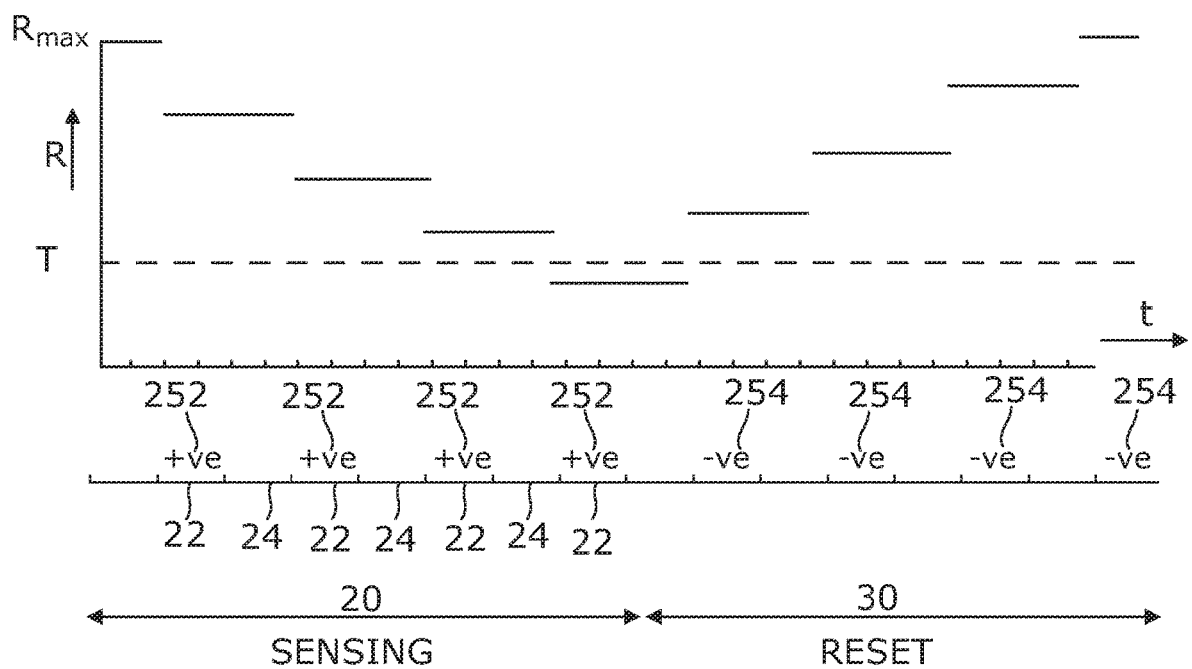
FIG. 3 shows another example embodiment of the subject matter described herein.

As illustrated in the example of FIG. 3, in at least some examples, the first resistance value Rmax is greater than the threshold value T and each provided pulse 252 reduces a resistance R of the memristor 260. As illustrated in FIG. 3, each provided pulse 252 reduces a resistance R of the memristor 260 by a temperature-dependent amount.

FIG. 3 illustrates a plot of the resistance R of the memristor 260 against time during a sensing mode 20 and also during a re-set mode 30.

In this example, during the sensing mode 20 pulses 252 of a first polarity (e.g. +ve pulses) are applied 22 periodically during the sensing mode 20. In the time period between the periodic application of one or more positive pulses 252 to the memristor, there is measurement 24 of the resistance R of the memristor 260. When it is detected that the resistance of the memristor R has reached a threshold value T (e.g. is less than or equal to T), the mode of the apparatus 200 changes from the sensing mode 20 to the re-set mode 30. During the re-set mode 30, pulses 254 of a second polarity (e.g. −ve pulses) are applied periodically to the memristor 260 increasing its resistance R.

Figure 4:
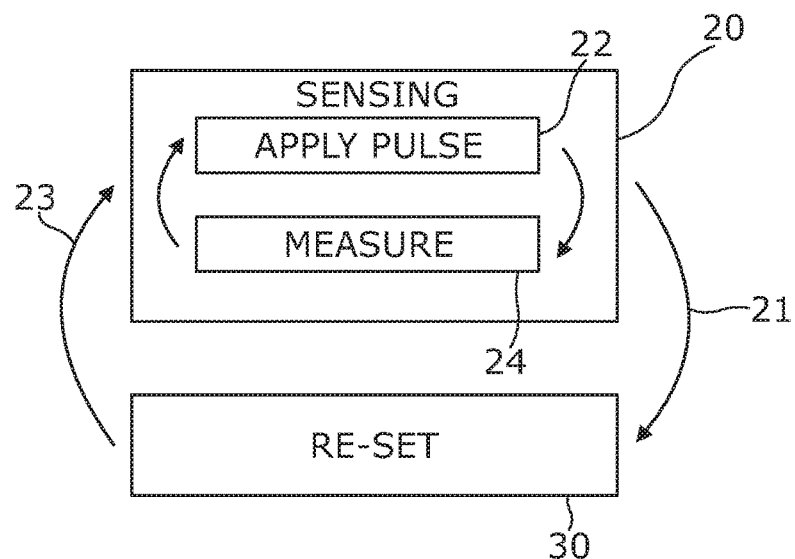
FIG. 4 shows another example embodiment of the subject matter described herein.

As illustrated in FIG. 3, and FIG. 4, during the sensing mode 20, the apparatus 200 is configured to alternately (i) provide 22 a fixed number of one or more controlled pulses 252 of a first polarity to the memristor 260 to change an electrical characteristic of the memristor in a first sense and (ii) measure 24 the electrical characteristic of the memristor 260.

If the electrical characteristic of the memristor 260 has reached the threshold value (T), the apparatus 200 is configured to wirelessly signal 104 to the probe apparatus 100 that the electrical characteristic R of the memristor 260 has reached the threshold value T and is configured to then switch 21 from the sensing mode 20 to the re-set mode 30 for re-setting the electrical characteristic of the memristor 260.

During the re-set mode 30, the apparatus 200 is configured to re-set the electrical characteristic R of the memristor 260. Re-setting the electrical characteristic R of the memristor 260 comprises repeatedly providing one or more pulses 254 of a second polarity to the memristor 260 to change the electrical characteristic of the memristor 260 in a second sense.

In some, but not necessarily all, examples, in each period of the time-varying signal 102, the apparatus 200 is configured to provide a pulse 252 of a first polarity to the memristor 260 to change the electrical characteristic R of the memristor 260 in the first sense and then measure the electrical characteristic R of the memristor 260. If the electrical characteristic of the memristor 260 consequently reaches the threshold value then wirelessly signaling 104 to the probe apparatus 100 and re-setting the memristor 260 occurs.

In at least some examples, the received time-varying signal 102 is a regular periodic signal used as a synchronization signal by the apparatus 200. For example, the time-varying signal can be sinusoidal signal in some examples.

In at least some examples, the received time-varying signal 102 is used to transfer power to the apparatus 200. The apparatus comprises circuitry configured to use power transferred by the received time-varying signal 102 to the apparatus 200.

After completing the re-set of the memristor 260, the mode of the apparatus 200 can, for example, return 23 to the sensing mode 20 as illustrated in FIG. 4.

Figure 5:
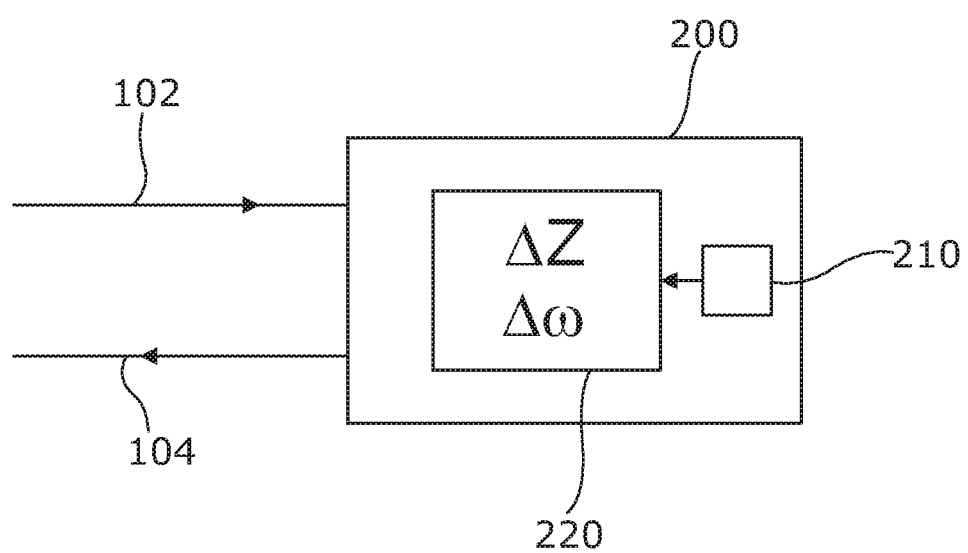
FIG. 5 shows another example embodiment of the subject matter described herein.

FIG. 5 illustrates an example of the apparatus 200 in which an electric circuit 220 is used to produce the wireless signal 104 that indicates that the electrical characteristic of the memristor 260 has reached the threshold value. The electrical circuit 220 is configured to provide at least part of the means 202 for wirelessly receiving, from the probe apparatus 100, the time-varying signal 102 and at least part of the means 204, 270 for wirelessly signaling to the probe apparatus 100 when the electrical characteristic of the memristor 260 reaches the threshold value.

In at least some examples, the impedance Z of the electrical circuit 220 is modified when the electrical characteristic of the memristor 260 reaches the threshold value. The change in impedance of the electrical circuit 220 can be detected in a number of ways. It can for example be detected passively because the change in impedance will change the reflection/transmission coefficients of the apparatus 200 to the received signal 102. The electrical circuit 220 can be configured as a resonant electrical circuit and the change in impedance of the resonant electrical circuit 220 when the electrical characteristic of the memristor 260 reaches the threshold value, can change a resonant frequency of the resonant electrical circuit 220 which causes a change in the characteristic of the wireless signal 104.

In some examples, the resonant electrical circuit 220 comprises an inductance and a capacitance. The inductance may be provided by an inductive coil which may be used to couple with a corresponding inductive coil in the probe apparatus 100. In other examples, the resonant electrical circuit 220 is a radio frequency resonant electrical circuit that is connected to an antenna. In some examples, the antenna is configured to communicate with the probe apparatus 100 in the near-field. In other examples, the antenna is configured to communicate with the probe apparatus 100 in the far-field.

Figure 6:
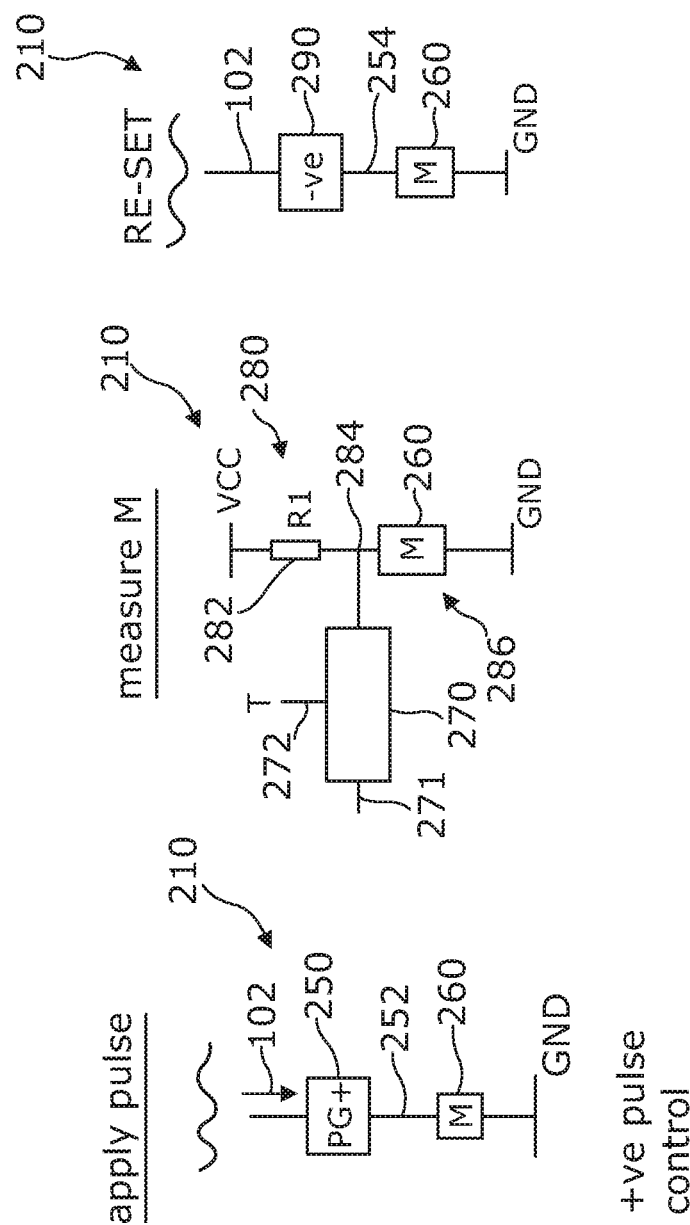
FIG. 6A, 6B, 6C shows another example embodiment of the subject matter described herein.

FIGS. 6A, 6B and 6C illustrate circuitry 210 within the apparatus 200 that enables the method illustrated in FIG. 4. As illustrated in FIG. 6A, the circuitry 210 comprises a pulse generator 250. The pulse generator is circuitry that provides the means 250 for enabling provision of one or more pulses 252. During the sensing mode 20, the pulse generator 250 is configured to provide 22 a fixed number of one or more controlled pulses 252 of a first polarity to the memristor 260 to change an electrical characteristic of the memristor 260 in a first sense.

The pulse generator 250 is configured to generate pulses 252 where a size of the pulses 252 generated is independent of the time-varying signal 102. In at least some examples, the one or more pulses 252 are square wave pulses that have a fixed amplitude and a fixed width. In some examples, the pulse generator 250 and the pulse generation is enabled by and synchronized to the time-varying signal 102. The time-varying signal 102 can, for example, be a regular periodic signal used as a synchronization signal at the apparatus 200.

FIG. 6B illustrates that the circuit 210 can be configured to measure 24 the electrical characteristic of the memristor 260. In this example, the means 204, 270 for wirelessly signaling 104 to the probe apparatus 100 when the electrical characteristic of the memristor 260 reaches a threshold value comprises a voltage divider circuit 280. The voltage divider circuit 280 comprises the memristor 260 as a variable resistor connected via a node 284 to a fixed resistor 282 of resistance R Ohms. A comparator 270 is configured to receive an input from the node 284 of the voltage divider circuit 280. The comparator 270 additionally, in this example, receives an input VTH 272 that sets athreshold in volts equivalent to the threshold T is Ohms. The comparator produces an output signal 271 when the resistance of the memristor 260 reaches the threshold value T. This occurs when the voltage at the node 284 reaches the threshold voltage VTH. If the voltage across the voltage divider circuit 280 is VD, then T*VD=(R+T)*VTH relates the threshold T in Ohms to the threshold VTH in volts.

The comparator 270 is circuitry that provides at least a part of the means 204, 270 for wirelessly signaling to the probe apparatus 100 when the electrical characteristic (resistance R) of the memristor 260 reaches a threshold value T.

It will be appreciated from the foregoing that it is possible to control temperature detection by the memristor 260 by controlling one or more of a frequency of the time-varying signal 102, which in turn controls the periodicity of the pulses 252; controlling the quanta of energy delivered by each pulse 252 by for example controlling the pulse size in terms of amplitude and/or duration; and by controlling the threshold T.

FIG. 6C illustrates the circuitry 210 when operating to re-set 30 the memristor 260. The circuitry 210 is configured to re-set the electrical characteristic of the memristor 260 by repeatedly providing pulses 254 of a second polarity to the memristor 260 to change the electrical characteristic of the memristor in a second sense. The circuitry 210 provides at least part of the means 290 for re-setting the electrical characteristic of the memristor 260.

Figure 7:
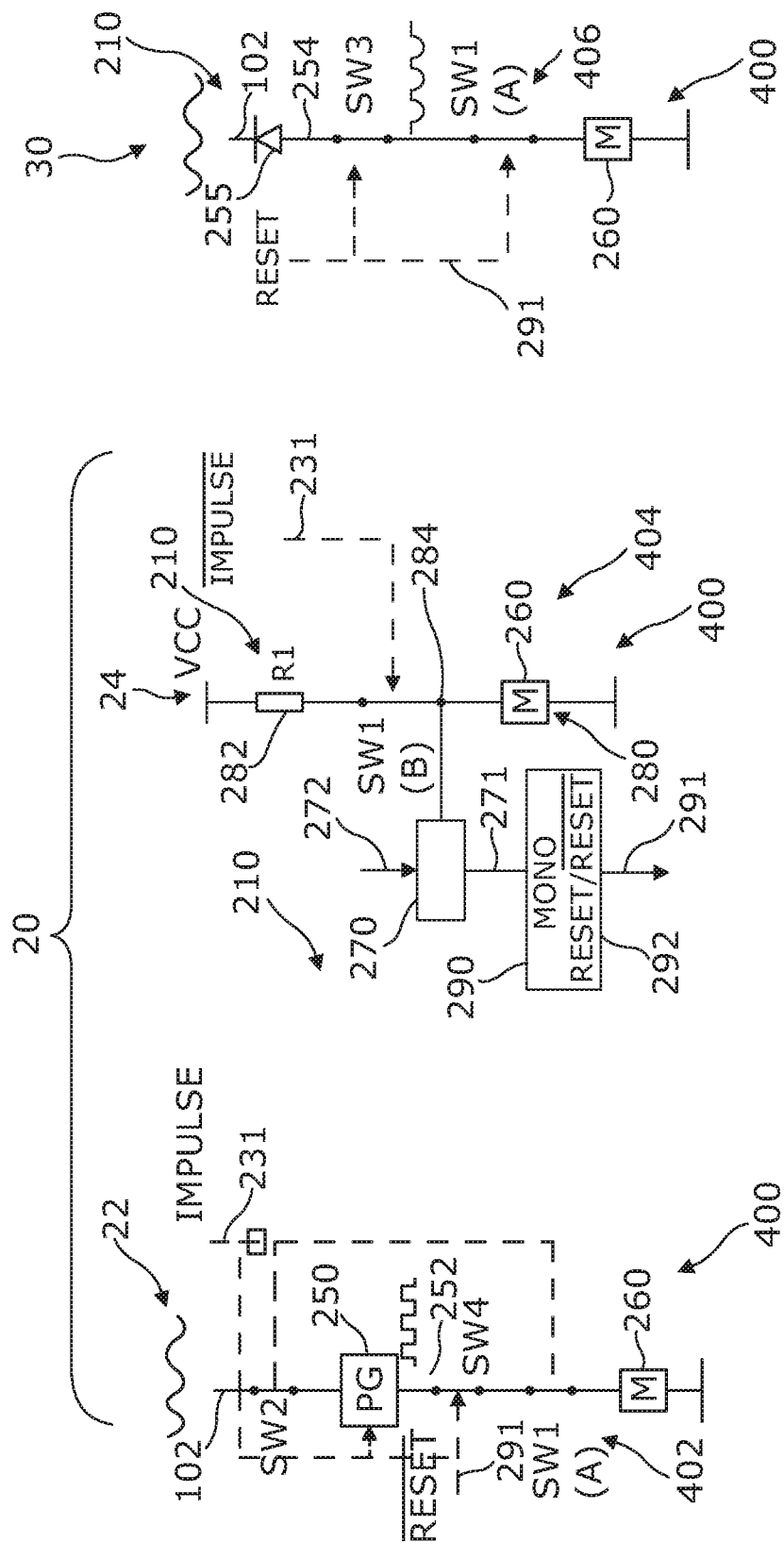
FIG. 7A, 7B, 7C shows another example embodiment of the subject matter described herein.

FIGS. 7A, 7B and 7C are specific implementations of the corresponding circuits illustrated in FIGS. 6A, 6B and 6C respectively. In these examples, the circuitry 210 of FIGS. 6A, 6B and 6C is switch-based circuitry 400 comprising a plurality of switches SWn. The plurality of switches SWn are configurable to a first configuration 402 (FIG. 7A), a second configuration 404 (FIG. 7B) and a third configuration 406 (FIG. 7C).

When the switches SWn are in the first configuration 402 they are configured to apply 22 one or more pulses 252 of a first sense to the memristor 260. When the switches SWn are in the second configuration 404 they are configured to enable measuring 24 of the electrical characteristic of the memristor 260. When the switches SWn are in the third configuration 406 they are configured to repeatedly apply pulses 254 of a second sense to the memristor 260 to re-set 30 the memristor 260.

The plurality of switches comprise at least one switch SW1, for switching between the first configuration 402 and the second configuration 404. In the first configuration 402 the switch SW1 is in a position A and in the second configuration 404 the switch SW1 is in the position B. The at least one switch SW1 can, for example, be controlled by the time-varying signal 102. It is used to toggle between the sub-states 22, 24 within the sensing mode 20 as illustrated in FIG. 4.

The circuit 400 also comprises at least one switch SW3, that is actuated when the electrical characteristic of the memristor 260 reaches the threshold value T, for switching to the third configuration 406.

Referring to FIG. 7A, in the first configuration 402 of the circuit 400, the pulse generator 250 applies a pulse 252 of the first sense to the memristor 260 that is synchronized to the time-varying signal 102. The pulse generator 250 may apply a single pulse 252 or a periodic sequence of pulses 252. In the example of FIG. 3, the pulses are positive. The pulses may have a controlled form in that they have a fixed and consistent amplitude and a fixed and consistent duration.

In FIG. 7A, as the mode of the apparatus 200 is in the sensing mode 20 and is not in the re-set mode 30, the RESET signal 291 is logic LOW. The switch SW4 is closed, the pulse generator 250 is enabled and a route for the impulse signal 231 is provided to control the switch SW2 and the switch SW1. A logic HIGH impulse signal 231 closes the switch SW2 and moves the switch SW1 to the position A. The closure of the switch SW2 provides the time-varying input signal 102 to the pulse generator 250. The closure of the switch SW4 and the switch SW1 in position A, provides a route for the pulse or pulses 252 from the pulse generator 250 to the memristor 260.

In FIG. 7B, the impulse signal 231 has changed polarity compare to FIG. 7A and is now logic LOW. As a consequence, the switch SW2 is opened and the switch SW1 has been moved to position B. The movement of the switch SW1 to position B creates the voltage divider circuit 280 that enables measurement of the resistance of the memristor 260 by the comparator 270 as previously described with reference to FIG. 6B. In this example, the output of the comparator 271 is used to trigger a monostable circuit 292 which provides the re-set signal 291 (logic HIGH) causing the transition of the apparatus from the sensing mode 20 to the re-set mode 30 as a consequence of the resistance of the memristor 260 reaching the threshold value. The monostable circuit 292 controls a duration of the reset mode 30.

In FIG. 7C, the polarity of the re-set signal 291 has changed compared to FIGS. 7A and 7B. It is now logic HIGH. As a consequence, the switch SW3 is closed and the switch SW1 is moved to position A. The time-varying input signals 102 are rectified by a diode 255 to produce pulses of the second sense (negative pulses) 254. These pulses are applied via the switch SW3 and the switch SW1, in position A, to the memristor 260. The train of pulses 254 of the second sense applied to the memristor 260 based on the rectification of the time-varying signal 102 re-sets the memristor as described in relation to FIG. 3. The train of the pulses can, for example, have a fixed duration that is sufficient to re-set the electrical characteristic of the memristor. The fixed duration can be controlled by the monostable circuit 292 illustrated in FIG. 7B.

Figure 8:
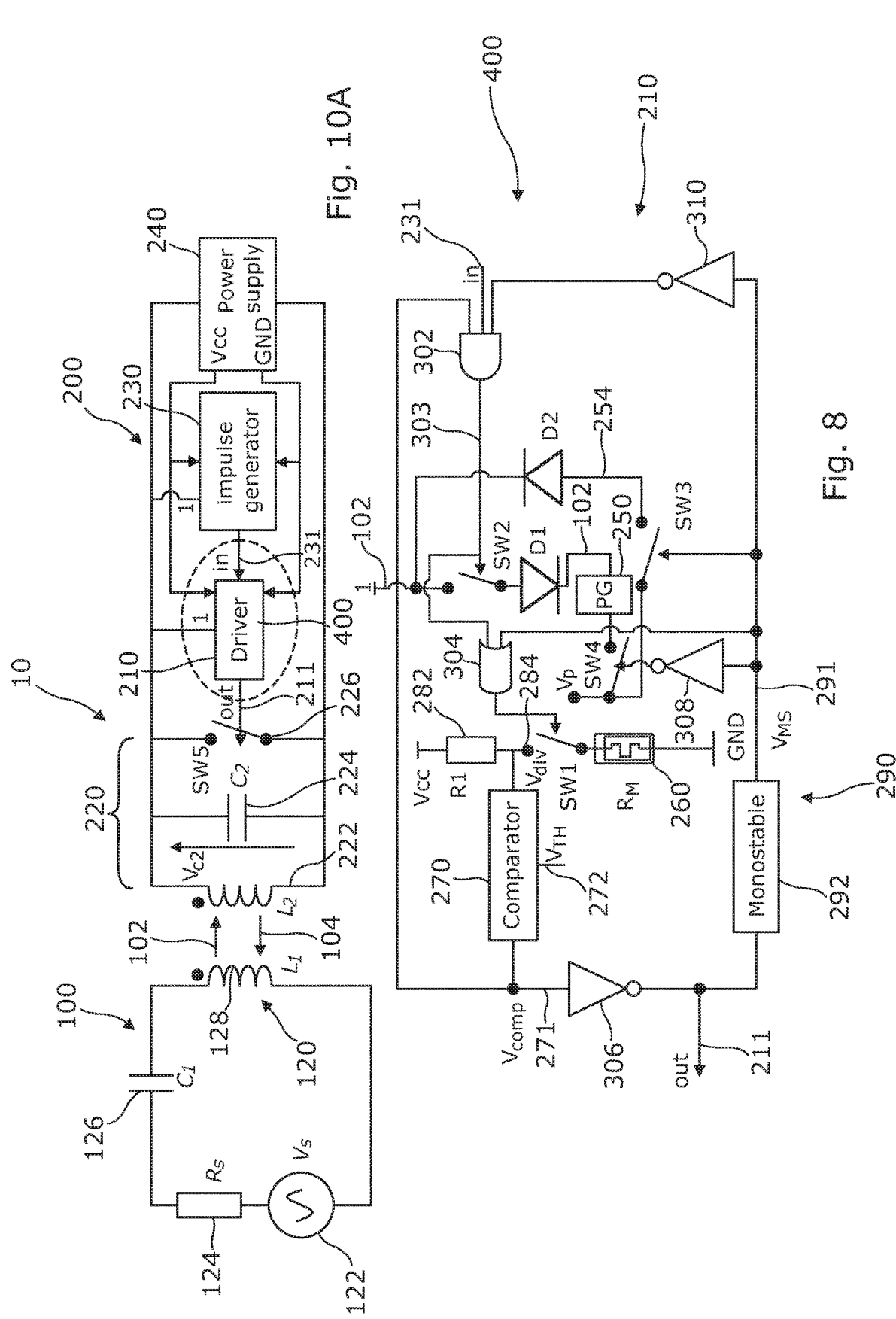
FIG. 8 shows another example embodiment of the subject matter described herein.
Figure 9:
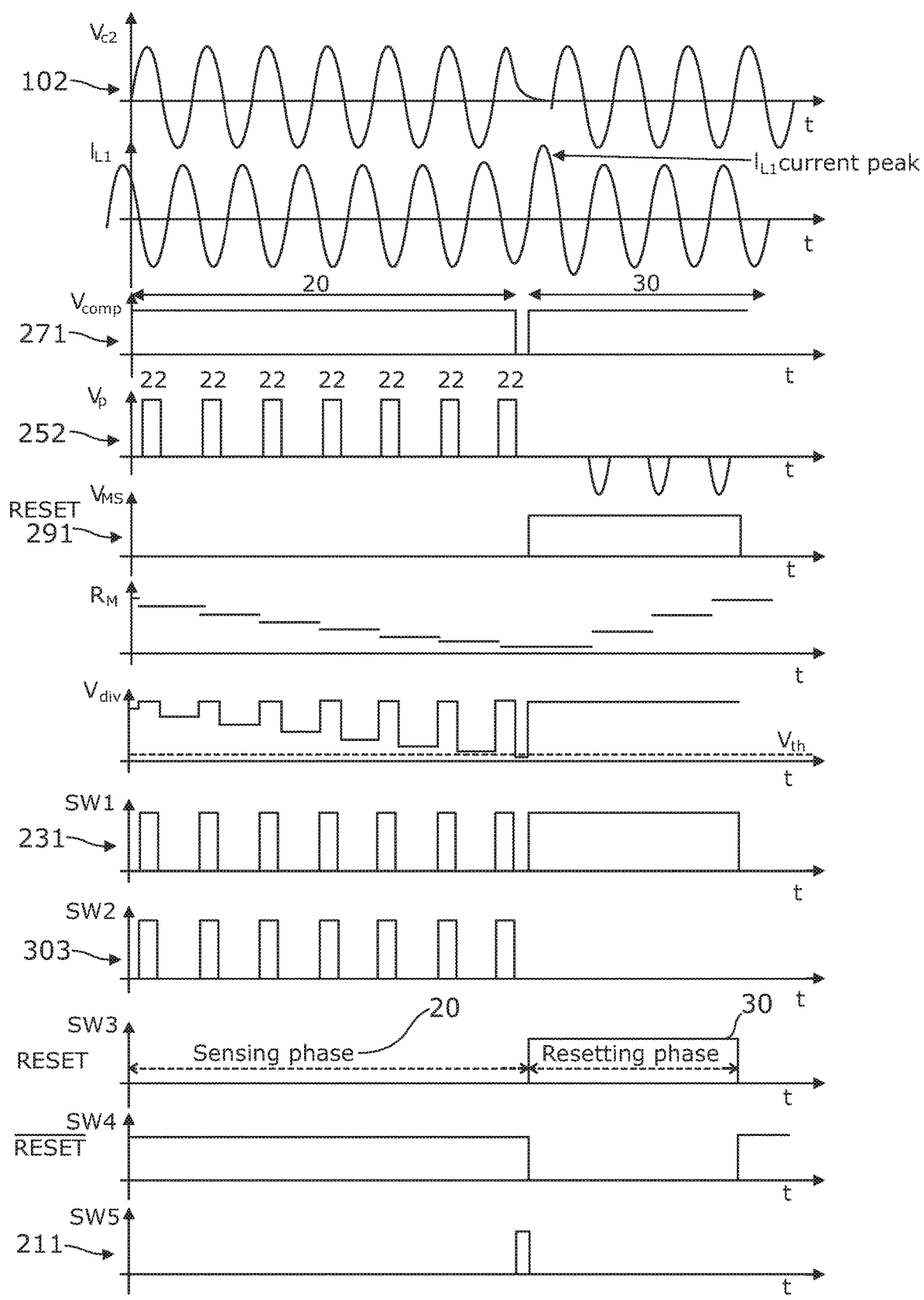
FIG. 9 shows another example embodiment of the subject matter described herein.

FIG. 8 illustrates an example of circuit 400 that operates as has been described in relation to FIGS. 7A, 7B and 7C. The signals associated with the circuit 400 are illustrated in FIG. 9.

Initially, the circuitry 210, 400 is in the sensing mode 20. The output of the comparator Vcomp is logic HIGH and the output of the monostable circuit 292 Vms 291 is logic LOW.

As a consequence the three-input AND gate 302 passes the impulse signal 231 as a control input 303 to the switch SW2 and through the OR gate 304 as a control input to the switch SW1. When the impulse signal 231 is logic HIGH, the operation of the circuit 210, 400 corresponds to that illustrated in FIG. 7A. The switch SW2 is closed, providing the time-varying signal 102, via forward biased diode D1, to the pulse generator 250. The output of the monostable circuit 292, via NOT gate 308, closes the switch SW4. Consequently, the pulses 252 output by the pulse generator 250 travel via the switch SW1 which is in a position A to the memristor 260. When the impulse signal 231 goes to logic LOW then the switch SW2 is opened and the switch SW1 moves from position A to a position B. The circuit 210, 400 then corresponds to the circuit illustrated in FIG. 7B. The resistance of the memristor 260 is sampled at the comparator 270.

If the resistance of the memristor 260 has not yet reached the threshold then the output of the comparator 271 remains logic HIGH. The logic HIGH output of the comparator, via NOT gate 306, provides a logic LOW output signal 211 and logic LOW input to the monostable 292. The output of the monostable circuit 292 remains logic LOW until triggered by a logic HIGH input. The logic LOW output of the monostable is converted by NOT gate 310 to a logic HIGH input to the AND gate 302.

If the resistance of the memristor 260 has reached the threshold value, then the output 271 of the comparator 270 goes momentarily logic LOW. The output of the comparator, via NOT gate 306, provides a logic HIGH output signal 211 (which enables the signal 104) and a logic HIGH input to the monostable 292.

The logic LOW output of the comparator 270 is provided as an input to the AND gate 302 and prevents the impulse signal 231 passing through the AND gate 302. The logic HIGH input to the monostable changes the state of the monostable circuit 292 from logic zero to logic HIGH for a predetermined duration.

The change in the output of the monostable circuit 292 to logic HIGH initiates the re-set state 30 of the apparatus 200. The AND gate 302 is disabled by the output 291 of the monostable circuit 292. The logic HIGH output 291 of the monostable circuit 292 is provided via NOT gate 310 as a logic LOW input to the AND gate 302. The change in the output of the AND gate 302 causes switch SW2 to open. The logic HIGH output 291 of the monostable circuit 292 is provided via NOT gate 308 as a logic LOW control input to the switch SW4. The switch SW4 is opened. The logic HIGH output 291 of the monostable circuit 292 is provided as a control input to the switch SW3. The switch SW3 is closed. The logic HIGH output 291 of the monostable circuit 292 is provided as an input to OR gate 304, which produces a logic HIGH control input to the switch SW1. The switch SW1 is moved to position A. The circuit 400, 210 therefore corresponds to that illustrated in FIG. 7C. The time-varying input signal 102 passes via diode D2 (reverse biased) to provide pulses 254 via the closed switch SW3 and the switch SW1, in position A, to the memristor 260. The negative pulses 254 are provided to the memristor for the duration specified by the monostable circuit 292. Once the time duration of the monostable circuit 292 has expired, the output of the monostable circuit 292 changes from logic HIGH to logic zero and the cycle is repeated.

Figure 10B:
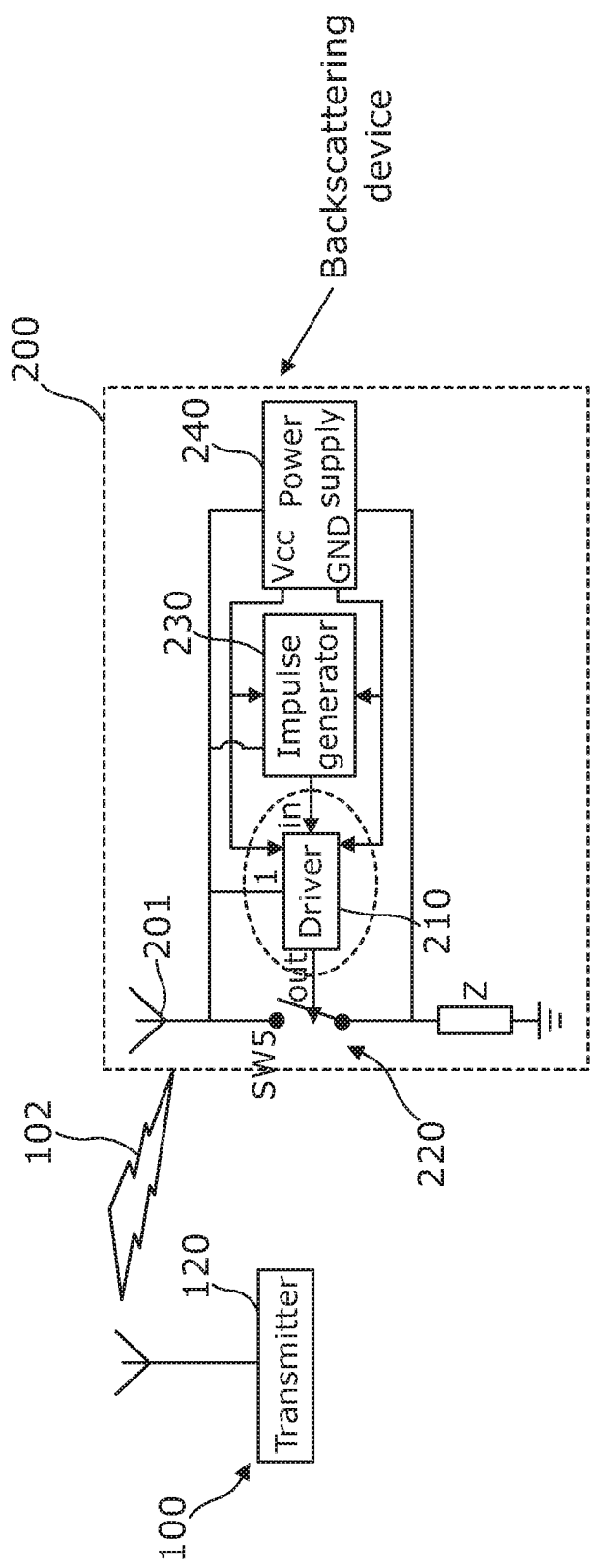
FIG. 10B shows another example embodiment of the subject matter described herein.

FIGS. 10A and 10B illustrate examples of the system 10 previously described in relation to FIG. 1. In each of these examples, the target apparatus 200 comprises driver circuitry 210, 400 that produces a control signal 211 used to vary the impedance of an electrical circuit 220. The driver circuitry 210, 400 receives impulse signals 231 from an impulse generator 230. The impulse generator 230 and the driver circuitry 210, 400 receive power from a power supply 240.

In the example of FIG. 10A, the electrical circuit 220 comprises an inductor 222 and a capacitor 224 which form a resonant electrical circuit that is coupled to a resonant electrical circuit on the probe apparatus 100. A bypass switch SW5 is configured to short-out the capacitor 224 when the signal 211 indicates that the resistance of the memristor 260 has reached the threshold value. The shorting out of the capacitor changes the impedance of the resonant electrical circuit 220. This change of the impedance of the resonant electrical circuit 220, causes a change of current through the inductor 128 which can be detected at the probe apparatus 100. The probe apparatus uses a resonant electrical circuit 120 comprising a time variable supply voltage 122, a resistor 124, a capacitor 126 and the inductor 128 to couple to the resonant electrical circuit 220 of the target apparatus 200. The resonant electrical circuit 120 of the probe apparatus and the resonant electrical circuit 220 of the target apparatus 200 have the same or substantially the same resonant frequency during the sensing mode 20 before the resistance of the memristor 260 reaches the threshold value.

In the example of FIG. 10B, the driver circuitry 210, 400 operates a switch SW5 that changes the impedance Z of an antenna 201. Changing the impedance of the antenna 201 changes the ratio of transmission to reflection at a particular frequency of the time-varying signal 102. A transmitter 120 in the probe apparatus 100 can be configured to detect this change in reflection coefficient. Consequently, when the resistance of the memristor 260 reaches the threshold value, the switch SW5 is closed, the impedance of the antenna 201 changes and this can be detected at the probe apparatus 100 as the wireless signal 104. The antenna 21 operates as a resonant electrical circuit and the interconnection of the impedance changes the resonance.

The probe apparatus 100, as described with reference to FIG. 1, comprises circuitry 114 that is configured to determine (indirectly) a number of pulses applied to the memristor 260 by the target apparatus 200 between a preceding re-set of the memristor 260 and detecting the wireless signal 104 indicating that the electrical characteristic of the memristor 260 has reached the threshold value. The probe apparatus 100 uses the determined number of pulses to look up, for example in look-up table 118, a temperature value dependent upon the threshold value and the number of pulses.

The circuitry 114 may not actually determine the number of pulses but may instead determine a time period that is equivalent to a number of pulses using timing circuitry 116. This is possible when the time-varying variable signal 102 has a constant frequency and causes a constant, periodic train of pulses to be applied to the memristor 260 during the sensing mode 20.

It will therefore be appreciated that the probe apparatus 100 is configured to remotely measure a temperature of a memristor 260. The probe apparatus 100 comprises:
means 114 for remotely detecting when resistance of the memristor 260 reaches a threshold resistance value;
means for determining the number of pulses applied to the memristor 260 since a preceding re-set of the memristor 260; and
means for using the number of pulses to look up a temperature value dependent upon the threshold resistance value and the number of pulses.

Figure 11:
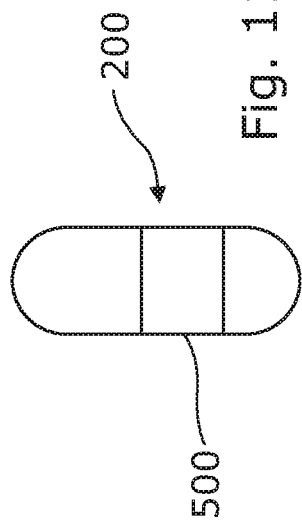
FIG. 11 shows another example embodiment of the subject matter described herein.

FIG. 11 illustrates an example of the target apparatus 200. The target apparatus 200 has simple, low power circuitry. The target apparatus 200 can therefore be operated without the need to replace or recharge the power supply 240 for an extended period. In one example, the target apparatus 200 is configured in a protective non-toxic housing 500 suitable for in-vitro use. As a consequence, the target apparatus 200 can be used as an in-body or implanted temperature sensor. The probe apparatus 100 can remain outside the body. In this way, it is possible to obtain a low-cost reliable temperature sensor.

As used in this application, the term 'circuitry' may refer to one or more or all of the following:
(a) hardware-only circuitry implementations (such as implementations in only analog and/or digital circuitry) and
(b) combinations of hardware circuits and software, such as (as applicable):
(i) a combination of analog and/or digital hardware circuit(s) with software/firmware and
(ii) any portions of hardware processor(s) with software (including digital signal processor(s)), software, and memory(ies) that work together to cause an apparatus, such as a mobile phone or server, to perform various functions and
(c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

Components that are described or illustrated as interconnected or connected can be operationally coupled and in this case any number or combination of intervening elements can exist (including no intervening elements).

Where a structural feature has been described, it may be replaced by means for performing one or more of the functions of the structural feature whether that function or those functions are explicitly or implicitly described.

As used here 'module' refers to a unit or apparatus that excludes certain parts/components that would be added by an end manufacturer or a user. The apparatus 200 can be a module.

The above described examples find application as enabling components of:
automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although embodiments have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain embodiments, those features may also be present in other embodiments whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

What is claimed is:

1. An apparatus comprising:
a memristor;
circuitry for wirelessly receiving, from another apparatus, a time-varying signal;
circuitry for enabling, responsive to the received time-varying signal, provision of one or more pulses to the memristor to change an electrical characteristic of the memristor;
circuitry for wirelessly signalling to the other apparatus when the electrical characteristic of the memristor reaches a threshold value and, in response to the electrical characteristic of the memristor reaching the threshold value, for determining a number of pulses applied to the memristor or a time period that is equivalent to the number of pulses since a previous reset; and
circuitry for re-setting the electrical characteristic of the memristor.

2. An apparatus as claimed in claim 1, wherein the circuitry for enabling, responsive to the received time-varying signal, provision of one or more pulses is configured to provide, responsive to the received time-varying signal, a periodic sequence of pulses,
wherein the circuitry for re-setting the electrical characteristic of the memristor is configured to reset the electrical characteristic of the memristor to a first resistance value,
wherein the circuitry for wirelessly signalling is configured to wirelessly signal when the resistance of the memristor reaches the threshold value, and
wherein the number of pulses provided to the memristor to change the resistance of the memristor from the first resistance value to reach the threshold value is a temperature indicator.

3. An apparatus as claimed in claim 2, wherein the first resistance value is greater than the threshold value and each provided pulse reduces a resistance of the memristor.

4. An apparatus as claimed in claim 1, wherein the received time-varying signal is a regular periodic signal used as a synchronisation signal.

5. An apparatus as claimed in claim 1, comprising a resonant electrical circuit configured to provide at least part of the circuitry for wirelessly receiving, from another apparatus, the time-varying signal and at least part of the circuitry for wirelessly signalling to the other apparatus when the electrical characteristic of the memristor reaches the threshold value.

6. An apparatus as claimed in claim 5, wherein an impedance of the resonant circuit is modified when the electrical characteristic of the memristor reaches the threshold value.

7. An apparatus as claimed in claim 1, wherein the circuitry for wirelessly signalling to the other apparatus when the electrical characteristic of the memristor reaches a threshold value comprises a voltage divider circuit, the voltage divider circuit comprising the memristor as a variable resistor connected via a node to a fixed resistor, and a comparator configured to receive an input from the node of the voltage divider circuit.

8. An apparatus as claimed in claim 1, wherein the one or more pulses are square wave pulses that have a fixed amplitude and a fixed width.

9. An apparatus as claimed in claim 1, comprising a pulse generator wherein pulse generation is enabled by and synchronised to the time-varying signal.

10. An apparatus as claimed in claim 1, configured to operate in a first sensing mode or a second re-set mode,
wherein during the first sensing mode the apparatus is configured to alternately
(i) provide a fixed number of one or more controlled pulses of a first polarity to the memristor to change an electrical characteristic of the memristor in a first sense; and
(ii) measure the electrical characteristic of the memristor and, if the electrical characteristic of the memristor has reached the threshold value, wirelessly signal to the other apparatus that the electrical characteristic of the memristor has reached the threshold value
and then switch from the first sensing mode to the second re-set mode for re-setting the electrical characteristic of the memristor, and
wherein during the second re-set mode the apparatus is configured to re-set the electrical characteristic of the memristor, wherein re-setting the electrical characteristic of the memristor comprises repeatedly providing a pulse of a second polarity to the memristor to change an electrical characteristic of the memristor in a second sense.

11. An apparatus as claimed in claim 1, comprising a circuit comprising a plurality of switches that are configurable to:
a first configuration for applying a pulse of a first sense to the memristor or a second configuration for measuring the electrical characteristic of the memristor or a third configuration for repeatedly applying a pulse of a second sense to the memristor,
wherein the plurality of switches comprise at least one switch, controlled by the time-varying signal, for switching between the first configuration and the second configuration and at least one switch, actuated when the electrical characteristic of the memristor reaches the threshold value, for switching to the third configuration.

12. An apparatus as claimed in claim 11, wherein in the first configuration a pulse generator or the pulse generator applies a pulse of the first sense and a controlled form to the memristor that is synchronised to the time-varying signal,
and wherein in the third configuration a train of pulses of the second sense is applied to the memristor based on rectification of the time-varying signal, wherein the train of pulses has a fixed duration that is sufficient to re-set the electrical characteristic of the memristor.

13. An apparatus as claimed in claim 1, comprising circuitry for using power transferred by the received time-varying signal to the apparatus.

14. An apparatus as claimed in claim 1, configured in a protective non-toxic housing suitable for in-vivo use.

15. A system comprising:
an apparatus comprising:
a memristor;
circuitry for wirelessly receiving, from another apparatus, a time-varying signal;
circuitry for enabling, responsive to the received time-varying signal, provision of one or more pulses to the memristor to change an electrical characteristic of the memristor;
circuitry for wirelessly signalling to the other apparatus when the electrical characteristic of the memristor reaches a threshold value and, in response to the electrical characteristic of the memristor reaching the threshold value, for determining a number of pulses applied to the memristor or a time period that is equivalent to the number of pulses since a previous reset of the memristor; and
circuitry for re-setting the electrical characteristic of the memristor
and the other apparatus, wherein the other apparatus comprises:
circuitry for wirelessly providing the time-varying signal;
circuitry for wirelessly detecting a signal indicating that the electrical characteristic of the memristor has reached a threshold value; and
circuitry for estimating a temperature of the apparatus in dependence upon when the signal is wirelessly detected.

16. A system as claimed in claim 15, wherein the other apparatus comprises:
circuitry for determining the number of pulses applied to the memristor by the apparatus between the previous reset of the memristor and detecting the signal indicating that the electrical characteristic of the memristor has reached a threshold value; and
circuitry for using the determined number of pulses to look-up a temperature value dependent on the threshold value and the number of pulses.

17. A method comprising:
wirelessly receiving from another apparatus, a time-varying signal;
enabling, responsive to the received time-varying signal, provision of one or more pulses to a memristor to change an electrical characteristic of the memristor;
wirelessly signalling to the other apparatus when the electrical characteristic of the memristor reaches a threshold value and, in response to the electrical characteristic of the memristor reaching the threshold value, determining a number of pulses applied to the memristor or a time period that is equivalent to the number of pulses since a previous reset of the memristor; and
re-setting the electrical characteristic of the memristor.

18. The method as claimed in claim 17, wherein the enabling, responsive to the received time-varying signal, provision of one or more pulses is configured to provide, responsive to the received time-varying signal, a periodic sequence of pulses,
wherein the re-setting the electrical characteristic of the memristor is configured to reset the electrical characteristic of the memristor to a first resistance value,
wherein the wirelessly signalling is configured to wirelessly signal when the resistance of the memristor reaches the threshold value, and
wherein the number of pulses provided to the memristor to change the resistance of the memristor from the first resistance value to reach the threshold value is a temperature indicator.

19. The method as claimed in claim 18, wherein the first resistance value is greater than the threshold value and each provided pulse reduces a resistance of the memristor.

20. The method as claimed in claim 19, wherein the received time-varying signal is a regular periodic signal used as a synchronisation signal.

* * * * *